US012768898B2

(12) United States Patent
Du et al.

(10) Patent No.: US 12,768,898 B2
(45) Date of Patent: Oct. 20, 2026

(54) LOW VOLTAGE BATTERY HEALTH DIAGNOSTICS

(71) Applicant: GM Global Technology Operations LLC, Detroit, MI (US)

(72) Inventors: Xinyu Du, Oakland Township, MI (US); Kevin Matthew Corr, Sterling Heights, MI (US); Mateusz M. Nowak, Dearborn, MI (US); Tung-Wah Frederick Chang, Richmond Hill (CA); Sara Sadat Rahimifard, Richmond Hill (CA); Hong Wong, Toronto (CA); Huaizheng Mu, Oakland Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 560 days.

(21) Appl. No.: 18/366,284

(22) Filed: Aug. 7, 2023

(65) Prior Publication Data

US 2025/0052830 A1 Feb. 13, 2025

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3648* (2013.01); *G01R 31/367* (2019.01); *G01R 31/388* (2019.01); *G01R 31/389* (2019.01)

(58) Field of Classification Search
USPC ........................................................... 702/63
See application file for complete search history.

(56) References Cited

U.S. PATENT DOCUMENTS 10,300,807 B2 * 5/2019 Jin .......................... B60L 58/16
2008/0071483 A1 * 3/2008 Eaves ...................... H04Q 9/00
429/90

(Continued)

FOREIGN PATENT DOCUMENTS

EP 2068161 A2 6/2009

OTHER PUBLICATIONS

German Office Action for German Application No. 102023132922.7; dated Oct. 22, 2025; 11 pages.

*Primary Examiner* — Paul D Lee
(74) *Attorney, Agent, or Firm* — CANTOR COLBURN LLP

(57) ABSTRACT

A method of evaluating a low voltage (LV) battery system includes collecting parameters of the LV battery system, determining a health of the LV battery system based on one or more health indicators of a plurality of health indicators, and based on determining that the battery system is in an unhealthy condition, identifying a cause of the unhealthy condition based on selection of a set of health indicators. Determining the health includes identifying an enabling condition related to charging or discharging of the LV battery system, selecting a set of health indicators from the plurality of health indicators based on the identified enabling condition, estimating a value of each of the set of health indicators, and determining whether the LV battery system is in a healthy condition or the unhealthy condition based on the collected parameters and the value of each of the set of health indicators.

20 Claims, 6 Drawing Sheets

(51) Int. Cl.

| | |
|---|---|
| ***G01R 31/367*** | (2019.01) |
| ***G01R 31/388*** | (2019.01) |
| ***G01R 31/389*** | (2019.01) |

(56) References Cited

U.S. PATENT DOCUMENTS

| | | | | |
|---|---|---|---|---|
| 2009/0027056 | A1* | 1/2009 | Huang | G01R 31/392<br>320/132 |
| 2015/0239364 | A1* | 8/2015 | Baughman | B60L 58/13<br>701/33.4 |
| 2016/0363631 | A1* | 12/2016 | Frost | H01M 10/48 |
| 2018/0123185 | A1* | 5/2018 | Kim | G01R 31/392 |
| 2018/0196106 | A1* | 7/2018 | Sankavaram | F02N 11/108 |
| 2018/0348304 | A1* | 12/2018 | Tang | G01R 31/3648 |
| 2022/0283239 | A1* | 9/2022 | Kondo | G01R 31/392 |
| 2024/0351471 | A1* | 10/2024 | Andreasen | B60L 3/0046 |
| 2025/0321289 | A1* | 10/2025 | Zhang | B60L 58/16 |

* cited by examiner

LOW VOLTAGE BATTERY HEALTH DIAGNOSTICS

INTRODUCTION

The subject disclosure relates to battery systems, and more particularly to systems and methods for evaluation or assessment of low voltage battery systems in vehicles and/or other contexts.

Vehicles, including gasoline and diesel powered vehicles, as well as electric and hybrid electric vehicles, feature battery storage for purposes such as powering electric motors, electronics and other vehicle subsystems. Various battery assemblies may be included to provide power to a wide range of loads. For example, electric and hybrid vehicles include high voltage battery assemblies for powering high voltage loads (e.g., motors) and low voltage battery assemblies for powering low voltage loads (e.g., electronics, lighting, etc.).

SUMMARY

In one exemplary embodiment, a method of evaluating a low voltage (LV) battery system includes collecting parameters of the LV battery system, the parameters including at least one of a voltage, a current, a temperature and a state of charge (SOC), determining a health of the LV battery system based on one or more health indicators of a plurality of health indicators, and based on determining that the battery system is in an unhealthy condition, identifying a cause of the unhealthy condition based on the selection of the set of health indicators. Determining the health includes identifying an enabling condition related to charging or discharging of the LV battery system, selecting a set of health indicators from the plurality of health indicators based on the identified enabling condition, estimating a value of each of the set of health indicators, and determining whether the LV battery system is in a healthy condition or the unhealthy condition based on the collected parameters and the value of each of the set of health indicators.

In addition to one or more of the features described herein, the plurality of health indicators include a charging resistance, a ripple resistance, a dynamic discharging resistance and a capacity ratio, the capacity ratio being a ratio of a change in capacity to a change in voltage.

In addition to one or more of the features described herein, the cause is identified as a shorted cell in the LV battery system based on the charging resistance having a value above a charging resistance threshold, the cause is identified as a low state of health (SOH) based on at least one of a value of the charging resistance being above the charging resistance threshold, a value of the ripple resistance being above a ripple resistance threshold, a value of the dynamic discharging resistance being above a discharging resistance threshold, and a value of the capacity ratio being at or below a capacity ratio threshold, and the cause is identified as a low SOC based on the collected SOC being below a selected SOC, and at least one of the value of the charging resistance being at or below the charging resistance threshold, the value of the ripple resistance being at or below the ripple resistance threshold, the value of the dynamic discharging resistance being at or below the discharging resistance threshold, and the value of the capacity ratio being above the capacity ratio threshold.

In addition to one or more of the features described herein, the enabling condition for the charging resistance and the ripple resistance is a charging condition in which the LV battery system is being charged, and the enabling condition for the dynamic discharging resistance and the capacity ratio is a discharging condition in which the LV battery system is being discharged.

In addition to one or more of the features described herein, the enabling condition for the capacity ratio and the dynamic discharging resistance is a condition in which the LV battery system is turned off for a selected period of time.

In addition to one or more of the features described herein, a value of the dynamic discharging resistance is calculated based on a regression of current values sampled during the selected period of time.

In addition to one or more of the features described herein, a value of the capacity ratio is calculated based on integrating current values sampled during the selected period of time.

In addition to one or more of the features described herein, the LV battery system is part a vehicle, the vehicle including a high voltage battery system configured to power an electric motor.

In another exemplary embodiment, a system for evaluating a low voltage (LV) battery system includes a processing device configured to collect parameters of the LV battery system, the parameters including at least one of a voltage, a current, a temperature and a state of charge (SOC), the processing device configured to determine a health of the LV battery system based on one or more health indicators of a plurality of health indicators, and based on determining that the battery system is in an unhealthy condition, identify a cause of the unhealthy condition based on a selection of a set of health indicators. The processing device is configured to determine the health by identifying an enabling condition of the battery system, the enabling condition related to charging or discharging of the battery system, selecting the set of the health indicators based on the identified enabling condition, estimating a value of each of the set of health indicators, and determining whether the LV battery system is in a healthy condition or the unhealthy condition based on the collected parameters and the value of each of the set of health indicators.

In addition to one or more of the features described herein, the plurality of health indicators include a charging resistance, a ripple resistance, a dynamic discharging resistance and a capacity ratio, the capacity ratio being a ratio of a change in capacity to a change in voltage.

In addition to one or more of the features described herein, the cause is identified as a shorted cell in the LV battery system based on the charging resistance having a value above a charging resistance threshold, the cause is identified as a low state of health (SOH) based on at least one of a value of the charging resistance being above the charging resistance threshold, a value of the ripple resistance being above a ripple resistance threshold, a value of the dynamic discharging resistance being above a discharging resistance threshold, and a value of the capacity ratio being at or below a capacity ratio threshold, and the cause is identified as a low SOC based on the collected SOC being below a selected SOC, and at least one of the value of the charging resistance being at or below the charging resistance threshold, the value of the ripple resistance being at or below the ripple resistance threshold, the value of the dynamic discharging resistance being at or below the discharging resistance threshold, and the value of the capacity ratio being above the capacity ratio threshold.

In addition to one or more of the features described herein, the enabling condition for the charging resistance and the ripple resistance is a charging condition in which the LV battery system is being charged, and the enabling condition for the dynamic discharging resistance and the capacity ratio is a discharging condition in which the LV battery system is being discharged.

In addition to one or more of the features described herein, the enabling condition for the capacity ratio and the dynamic discharging resistance is a condition in which the LV battery system is turned off for a selected period of time.

In addition to one or more of the features described herein, a value of the dynamic discharging resistance is calculated based on a regression of current values sampled during the selected period of time.

In addition to one or more of the features described herein, a value of the capacity ratio is calculated based on integrating current values sampled during the selected period of time.

In addition to one or more of the features described herein, the LV battery system is part of a vehicle, the vehicle including a high voltage battery system configured to power an electric motor.

In yet another exemplary embodiment, a vehicle system includes a low voltage (LV) battery system configured to power LV components of a vehicle, and a processing device configured to collect parameters of the LV battery system, the parameters including at least one of a voltage, a current, a temperature and a state of charge (SOC), the processing device configured to determine a health of the LV battery system based on one or more health indicators of a plurality of health indicators, and based on determining that the battery system is in an unhealthy condition, identify a cause of the unhealthy condition based on a selection of a set of health indicators. The processing device is configured to determine the health by identifying an enabling condition of the battery system, the enabling condition related to charging or discharging of the battery system, selecting the set of the health indicators based on the identified enabling condition, estimating a value of each of the set of health indicators, and determining whether the LV battery system is in a healthy condition or the unhealthy condition based on the collected parameters and the value of each of the set of health indicators.

In addition to one or more of the features described herein, the plurality of health indicators include a charging resistance, a ripple resistance, a dynamic discharging resistance and a capacity ratio, the capacity ratio being a ratio of a change in capacity to a change in voltage.

In addition to one or more of the features described herein, the cause is identified as a shorted cell in the LV battery system based on the charging resistance having a value above a charging resistance threshold, the cause is identified as a low state of health (SOH) based on at least one of a value of the charging resistance being above the charging resistance threshold, a value of the ripple resistance being above a ripple resistance threshold, a value of the dynamic discharging resistance being above a discharging resistance threshold, and a value of the capacity ratio being at or below a capacity ratio threshold, and the cause is identified as a low SOC based on the collected SOC being below a selected SOC, and at least one of the value of the charging resistance being at or below the charging resistance threshold, the value of the ripple resistance being at or below the ripple resistance threshold, the value of the dynamic discharging resistance being at or below the discharging resistance threshold, and the value of the capacity ratio being above the capacity ratio threshold.

In addition to one or more of the features described herein, the enabling condition for the charging resistance and the ripple resistance is a charging condition in which the LV battery system is being charged, and the enabling condition for the dynamic discharging resistance and the capacity ratio is a discharging condition in which the LV battery system is being discharged.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
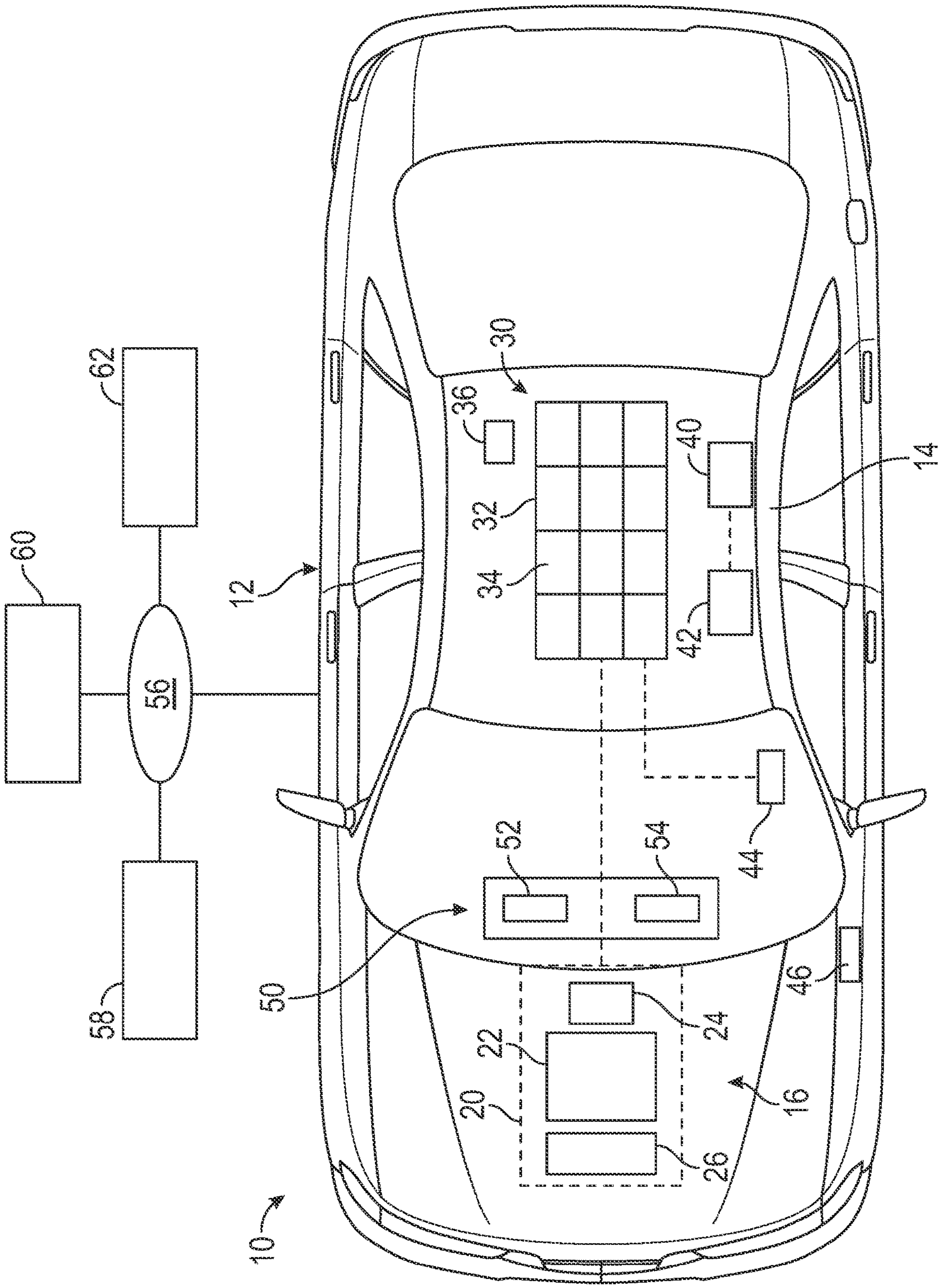
FIG. 1 is a top schematic view of a motor vehicle including high voltage and low voltage battery systems, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with one or more exemplary embodiments, methods, devices and systems are provided for monitoring and evaluating battery systems and/or estimating battery system health. An embodiment of a method includes collecting measurement data for a low voltage battery in, for example, an electric vehicle. Based on the presence of one or more enabling conditions, one or more health indicators are selected and values thereof are estimated for determining or predicting an unhealthy condition. In an embodiment, one or more health indicators are selected from a group that includes a charging resistance, a ripple resistance, a dynamic discharging resistance and a capacity ratio (i.e., a ratio of a change in capacity to a change in voltage).

A value or values of the selected health indicator(s) is/are compared to various threshold values (e.g., in combination with battery parameters such as state of charge and open circuit voltage). If a value is not within a healthy range defined by a threshold value, the method includes determining or predicting that the low voltage battery is in an unhealthy condition. The method may also include identifying a cause of the unhealthy condition based on which health indicator(s) was/were selected. Information regarding battery health may be stored and/or presented to a user or other system so that the unhealthy condition can be addressed.

Embodiments described herein present numerous advantages and technical effects. Embodiments provide effective methods for determining battery health that overcome present limitations. For example, a low voltage battery in a vehicle with a combustion engine can be assessed by monitoring health indicators (e.g., crank voltage, current and resistance) when the vehicle's starter is operated. However, purely electric vehicles do not have a starter; thus, these indicators are not available. Embodiments provide for effective battery monitoring by providing health indicators that do not rely on a starter.

In addition, monitoring a low voltage battery and assessing battery health is difficult using conventional battery measurements and health assessments. For example, isolating a battery fault or state of health from voltage and current measurements (e.g., current/voltage scatter plots) is challenging due to nonlinear data distributions and noise factors. Resistance estimations are also challenging, as there is a lack of excitation of the battery in many cases. Other indicators of battery health, such as capacity estimations, are difficult due to inaccuracies in state of charge measurements. Embodiments described herein overcome these limitations through the use of various health indicators that can be assessed in a variety of conditions.

The embodiments are not limited to use with any specific vehicle or device or system that utilizes battery assemblies, and may be applicable to various contexts. For example, embodiments may be used with automobiles, trucks, aircraft, construction equipment, farm equipment, automated factory equipment and/or any other device or system that may use high voltage battery packs or other battery assemblies.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, and if the vehicle is a hybrid electric vehicle, a fuel injection subsystem, an exhaust subsystem and others.

The vehicle 10 may be an electrically powered vehicle (EV), a hybrid vehicle or any other vehicle. In an embodiment, the vehicle 10 is an electric vehicle, which includes one or more electric motors and one or more drive systems. For example, the propulsion system 16 includes a drive unit 20 having an electric motor 22 and an inverter 24, as well as other components such as a cooling system 26. The inverter 24 (e.g., traction power inverter unit or TPIM) converts direct current (DC) power from a high voltage (HV) battery system 30 to poly-phase (e.g., two-phase, three-phase, six-phase, etc.) alternating current (AC) power to drive the motor 22. The battery system 30 may be configured as a rechargeable energy storage system (RESS).

The HV battery system 30 includes one or more battery assemblies. For example, the HV battery system 30 includes a high voltage (e.g., 400 V) battery pack 32 connected to the inverter 24. The battery pack 32 includes a plurality of battery modules 34, and each module 34 includes a number of individual cells (not shown). The battery pack 32 may be a single pack as shown, or may include multiple packs. The HV battery system 30 may be a rechargeable energy storage system (RESS), which may include various sensors readable by a monitoring device such as a RESS controller 36.

The HV battery system 30 may be electrically connected to other components, such as vehicle electronics and/or other battery systems. For example, the vehicle 10 includes at least one low voltage (LV) battery system including a LV battery 40 (e.g., a 12 Volt (V) battery pack). The LV battery 40 has a lower voltage rating than the HV battery pack 32. The voltage of the LV battery 40 may be 12 V, 48 V or any other suitable voltage. The LV battery 40 may also be a variable voltage battery system.

It is noted that the terms "high voltage" and "low voltage" are relative terms. Accordingly, these terms are not intended to limit the HV battery system 30 or the LV battery 40 to any specific voltage rating.

Aspects of power transfer are controlled via a control device (referred to as a LV controller 42), such as an auxiliary power module (APM). Power transfer includes discharging the LV battery 40, for example, to power electronics and other components of the vehicle 10. Power transfer also includes charging the LV battery 40 (e.g., from the battery pack 32 or an external source).

The LV battery 40 is used to power various components during vehicle modes or states. For example, when the vehicle 10 is on and/or in propulsion mode, the LV battery 40 powers vehicle controllers, power windows, power locks, lighting and/or other LV components. When the vehicle 10 is off, the LV battery 40 supplies power to all or selected vehicle controllers, so that certain vehicle functions are maintained. For example, the LV battery 40 powers controllers so that the vehicle 10 can be opened and turned on. In an embodiment, when the vehicle is turned off, the vehicle 10 enters a power off mode. During the power off mode, the LV battery 40 continues to provide power to vehicle controllers, so that the vehicle 10 can be turned on.

The vehicle 10 also includes a charging system, which can be used to charge the battery system 30 and/or to supply power from the battery system 30 to charge another energy storage system (e.g., vehicle-to-vehicle (V2V) and/or vehicle-to-everything (V2X) charging). In an embodiment, the charging system includes a charging control device 44, such as an onboard charging module (OBCM). The charging control device 44 connects the battery system 30 to a charge port 46 for charging vehicle battery systems and/or providing charge to external storage systems.

The vehicle 10 also includes a computer system 50 that includes one or more processing devices 52 and a user interface 54. The computer system 50 may communicate with other controllers, for example, to provide commands thereto in response to a user input. The various processing devices, modules and units may communicate with one another via a communication device or system, such as a controller area network (CAN) or transmission control protocol (TCP) bus.

The charging system, the RESS controller 36, the LV controller 42, the computer system 50 and/or other processing components in the vehicle 10 may be configured to communicate with various remote devices and systems such as charge stations and other vehicles. Such communication can be realized, for example, via a network 56 (e.g., cellular network, cloud, etc.) and/or via wireless communication. For example, the vehicle 10 may communicate with one or more charging stations 58, a remote entity 60 (e.g., a workstation, fleet management system, a computer, a server, a service provider, a technician, an engineer, etc.), and/or another vehicle 62.

The vehicle 10 includes or is connected to a battery monitoring and diagnostic system, which is configured to collect various parameters of the LV battery 40, and evaluate battery health based on one or more health indicators. The diagnostic system includes at least one processing device, which may be an internal control device such as the LV controller 42 or the RESS controller 36, and/or a remote device such as a processing device of the remote entity 60. The diagnostic system may include any number and combination of processing devices that can acquire battery measurements and other information, and determine battery health as described herein.

The diagnostic system utilizes one or more estimated or predicted battery characteristics or properties, which are referred to herein as "health indicators." The health indicators are used to determine whether a LV battery system such as the LV battery 40 is healthy, and may also be used to identify causes of unhealthy battery conditions. The diagnostic system may utilize any number and combination of health indicators to determine battery health.

The health indicators and methods are described herein in conjunction with the LV battery 40 and the vehicle 10, for illustration purposes. It is to be understood that embodiments described herein are applicable to any suitable battery system in any suitable context.

As discussed further herein, the diagnostic system is configured to determine battery health by selecting one or more health indicators from a plurality of health indicators. In an embodiment, the plurality of health indicators include a charging resistance, a ripple resistance, a dynamic discharging resistance and a capacity ratio.

Charging resistance is a resistance of a battery system during charging, denoted as Rc. This health indicator, which can also be characterized as charge acceptance, is estimated based on measurements taken during a vehicle mode in which charge is provided to the LV battery 40. The LV battery 40 may be charged during vehicle operation from the HV battery system 30, and/or charged while the HV battery system 30 is being charged (e.g., when the vehicle 10 is plugged into an electrical grid or charging station). In an embodiment, Rc is estimated based on measurements taken when a constant or varying charging current is applied to the LV battery 40.

Rc is estimated by collecting voltage (V) and current (I) measurements, as well as other information, such as open circuit voltage and state of charge of a battery system. Rc may be estimated using the Shepherd equation, which relates the voltage drop across an internal resistance to the charging current.

For example, Rc is calculated based on the following equation:

$$Rc = \frac{Vc - OCV}{Ic} \times \frac{Cn}{1 + \frac{Mc \times SOC}{C_c - SOC}},$$

where OCV is the open circuit voltage, SOC is the state of charge, Vc is voltage measured during constant charging, and Ic is current measured during constant charging. Cn is nominal capacity, Mc is a charge-transfer overvoltage coefficient, and Cc is normalized capacity. Generally, a lower value of Rc corresponds to greater battery health.

Another health indicator is a resistance of a battery system during discharging, which is referred to as dynamic discharging resistance and denoted by Rd. This health indicator is estimated based on measurements performed during discharging. For example, Rd is estimated based on measurements performed when the vehicle 10 is in an accessory mode, or other operating state in which the LV battery 40 is providing power to various low voltage components, such as controllers, lighting, infotainment system and others.

Rd is estimated by collecting voltage and current measurements, and performing a regression of samples performed over a power off period, as discussed further herein. Generally, a lower Rd value corresponds to greater battery health. The dynamic discharging resistance can be determined by sampling current and voltage over a short period of time (e.g., a few seconds).

Capacity ratio is another health indicator, which is a ratio of a change in capacity Q to a change in voltage V during discharging. The change in capacity is denoted dQ, and the change in voltage is denoted dV. Thus, the capacity ratio can be represented as dQ/dV. A larger value of dQ/dV corresponds to greater health.

Ripple resistance (also referred to as nominal resistance) is denoted as Rn, and is a measure of resistance to small disturbances (ripples) during charging. A lower value of Rn corresponds to greater battery health.

The ripple resistance Rn is a ratio of a change in voltage to a change in current during charging. For example, Rn is calculated based on the following equation:

$$Rn = \frac{V_{p1} - V_{p2}}{I_{p1} - I_{p2}},$$

where $V_{p1}$ is measured voltage at a first sample time, $V_{p2}$ is the measured voltage at a second sample time, $I_{p1}$ is measured current at the first sample time and $I_{p2}$ is the measured current at the second sample time.

Generally, the diagnostic system is configured to perform a method to estimate one or more health indicators and determine or predict whether a battery is healthy. As described herein, a "healthy" battery has no detected faults and has a high state of health (SOH). SOH may be determined as a percentage of a maximum battery charge to the battery's rated capacity. A "high SOH" is an SOH above a selected value (e.g., 10%, 25% or 50%).

The method includes measuring various battery parameters, and determining whether a LV battery system, such as the LV battery 40, is in an enabling condition. Based on the enabling condition, a set (i.e., one or more) of health indicators is selected. Values of the selected health indicator (s) is/are estimated and used to determine whether the LV battery system is healthy or unhealthy. It is noted that embodiments of the method may be passive (i.e., a battery can be evaluated without injection of signals). Thus, the method may be performed without the need for external signal sources or a separate battery tester.

Upon determining that the battery system is unhealthy, the diagnostic system utilizes the selection of health indicators in order to identify a cause of the unhealthy condition. In this way, the health indicators can not only be used to determine the health of a battery system, but can also be used to distinguish between various causes or problems that contribute to the unhealthy condition.

Figure 2:
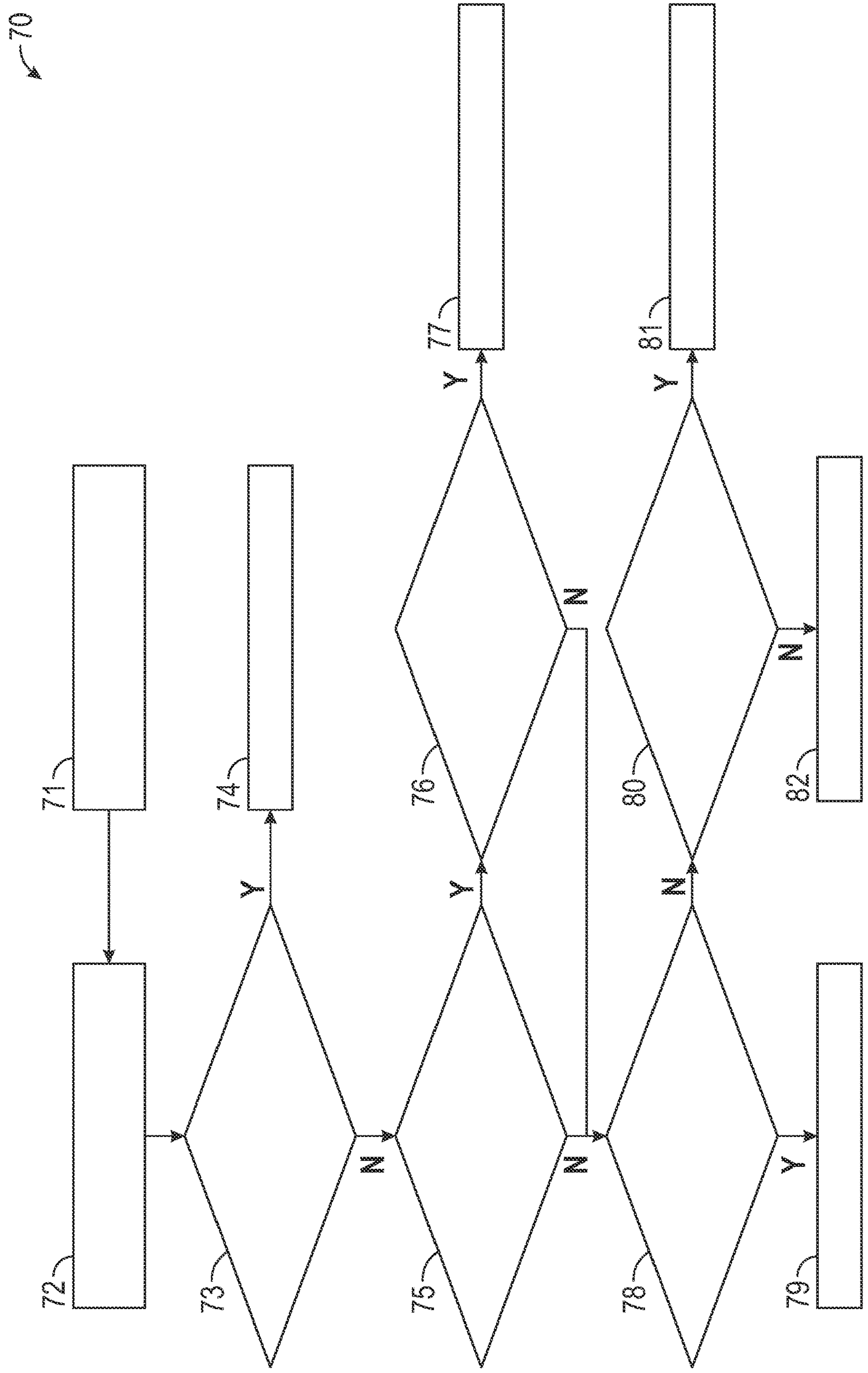
FIG. 2 is a flow diagram depicting aspects of a method of evaluating the health of a low voltage battery based on one or more health indicators, in accordance with an exemplary embodiment.

FIG. 2 depicts an embodiment of a method 70 of evaluating the health of a battery system. In an embodiment, the method is performed to evaluate a low voltage battery system (e.g., 12 V, 48 V, etc.), such as the LV battery 40.

The method 70 includes a number of steps or stages represented by blocks 71-82. The method 70 is not limited to the number or order of steps therein, as some steps represented by blocks 71-82 may be performed in a different order than that described below, or fewer than all of the steps may be performed.

The method 70 is described in conjunction with the LV controller 42 of FIG. 1, but is not so limited. The method 70 can be performed by any suitable processing device or system, such as a local processor (e.g., BMS controller or the RESS controller 36) and/or a remote processor (e.g., a fleet management system, data center or other remote entity 60).

The method 70 can be used to make a final decision regarding the health of a battery and/or a cause of an unhealthy condition. Alternatively, aspects of the method 70 (e.g., selection of health indicators and/or calculation of health indicator values) can be performed as part of other diagnostic methods and/or in conjunction with other diagnostic methods.

In addition, the method 70 is not limited to the specific health indicator calculations and conditions described therein, as other combinations of health indicators can be used. In addition, the method 70 may encompass a number of variations in techniques used to calculate or estimate health indicator values.

At block 71, a processor, such as the LV controller 42, receives a triggering signal. For example, collection of battery parameters is triggered by a power on signal or wake up signal from a vehicle controller.

At block 72, during a given vehicle mode, various battery parameters related to the LV battery 40 (or other low voltage battery system) are collected. The various parameters include current, voltage, SOC, OCV and/or other information relevant to battery health and the health indicators. OCV may be acquired from stored information (e.g., OCV is automatically measured when the vehicle 10 is turned off).

A set (i.e., one or more) of health indicators is selected from a plurality of health indicators. In an embodiment, the plurality of health indicators include the charging resistance Rc, the dynamic discharging resistance Rd, the capacity ratio dQ/dV and the ripple resistance Rn. Values of the health indicators may take any suitable form. For example, health indicator values may be raw values, normalized values and/or various derivations from raw values. For example, a health indicator value can be expressed as a discrete value, a range of values, a maximum, a minimum, a median, a mean, a trend, a variance, a standard deviation or other measure. In addition, health indicator values can be normalized to SOC, temperature and/or other parameters.

In an embodiment, health indicator selection is performed in response to the vehicle 10 and/or battery system meeting one or more enabling conditions. The enabling conditions are conditions conducive to estimating at least one health indicator.

One enabling condition is a charging condition, such as a condition in which the LV battery 40 is being charged. The charging condition may occur when the LV battery 40 is being charged from an external source, or when the LV battery 40 is being charged by the HV battery system 30. A charging condition is an enabling condition for the charging resistance Rc and the ripple resistance Rn.

Another enabling condition is a discharging condition, in which the LV battery 40 is supplying power to controllers and/or other vehicle components. The discharging condition may be an enabling condition for the dynamic discharging resistance Rd and the capacity ratio dQ/dV. Other enabling conditions for Rd and dQ/dV are discussed further herein (see FIGS. 3 and 4).

At block 73, the SOC is compared to a SOC threshold, and at least one selected health indicator value is compared to a respective threshold. If the SOC is greater than the SOC threshold, and at least one health indicator value is indicative of a healthy battery, the processor determines that the LV battery 40 is in a healthy condition (block 74).

For example, if the vehicle 10 is in a charging condition, a value for the charging resistance Rc is compared to a charging resistance threshold, and a value for the ripple resistance Rn is compared to a ripple resistance threshold. If the SOC exceeds the SOC threshold, and the charging resistance Rc value indicates a healthy battery (i.e., Rc is less than the charging resistance threshold) or the ripple resistance Rn value indicates a healthy battery (i.e., Rn is less than the ripple resistance threshold), the LV battery 40 is determined to be in a healthy condition.

Likewise, if the vehicle 10 is in a discharging condition, a value for the dynamic discharging resistance Rd is compared to a discharging resistance threshold, and a value for the capacity ratio dQ/dV is compared to a capacity ratio threshold. If the SOC exceeds the SOC threshold, and the dynamic discharging resistance Rd value indicates a health battery (i.e., Rd is less than the discharging resistance threshold) or the capacity ratio dQ/dV value indicates a healthy battery (i.e., dQ/dV is greater than the capacity ratio threshold), the LV battery 40 is determined to be in a healthy condition.

At block 75, if the LV battery 40 is not in the healthy condition, the processor compares the OCV to a threshold. If the OCV is less than the threshold (i.e., "low OCV"), and the vehicle 10 is in a charging condition, the charging resistance Rc value is compared to the charging resistance threshold (block 76). If the Rc value exceeds the threshold, the processor determines that the LV battery 40 is in a "short cell battery condition," in which a cell in the battery 40 has or will be shorted (block 77).

At block 78, if the OCV is greater than or equal to the OCV threshold, the selected health indicators are compared to their respective thresholds. If none of the health indicators satisfy their respective thresholds, the processor determines that the LV battery 40 is in a low state of health (SOH) at block 79.

At block 80, the processor determined whether the SOC is below a selected SOC threshold. If yes, the processor determines that the LV battery 40 has a low SOC (block 81), and may output this to a user or other system. If not, the LV battery 40 is considered to be in a healthy condition (block 82).

Any of the identified conditions, as well as battery measurements, can be stored for later analysis. In addition, any of the identified conditions, and/or measurements, can be presented to a user, such as a driver or a technician.

Figure 3:
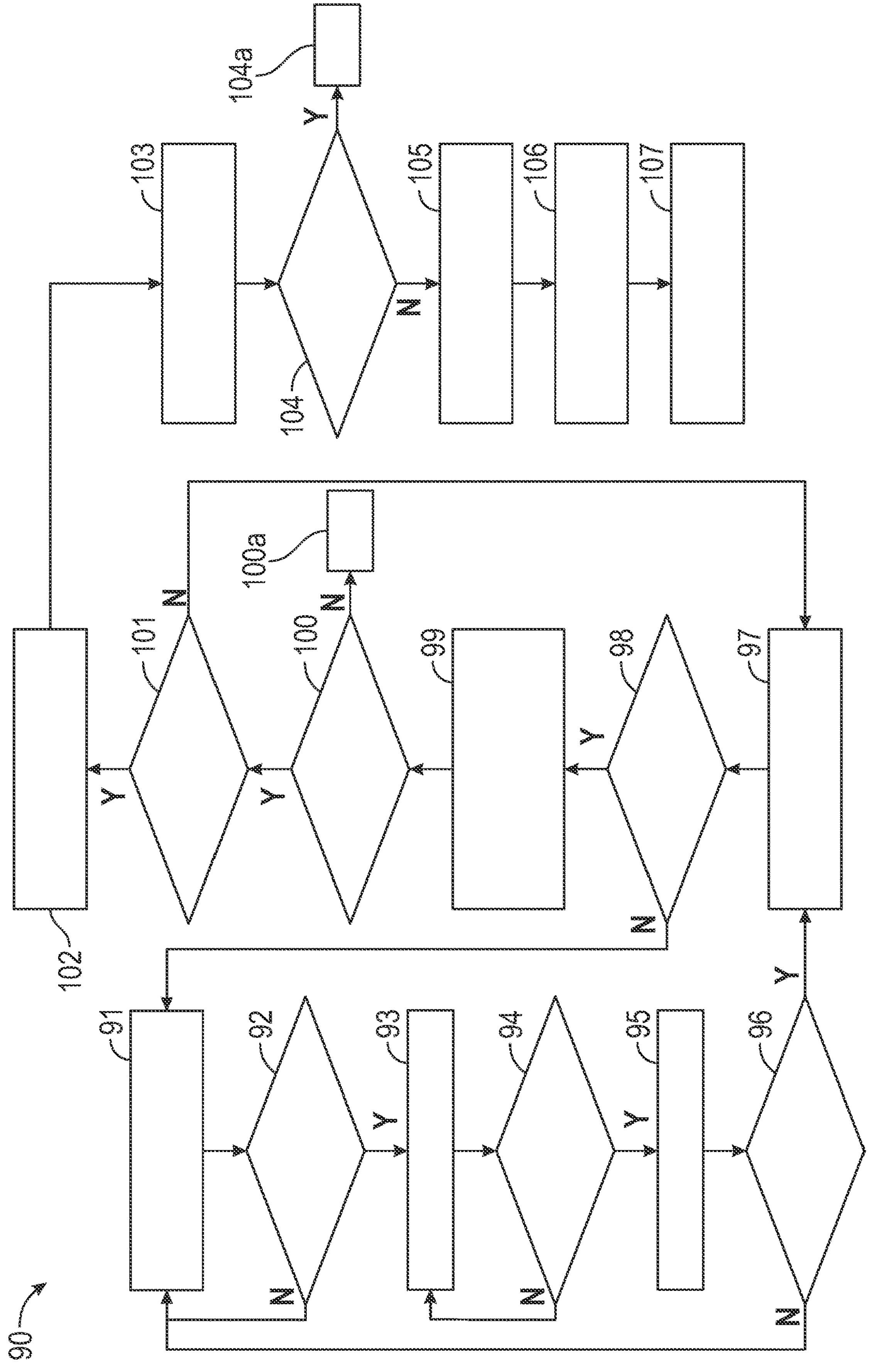
FIG. 3 is a flow diagram depicting aspects of a method of estimating a dynamic discharging resistance health indicator, in accordance with an exemplary embodiment.

FIG. 3 depicts an embodiment of a method 90 of estimating the dynamic discharging resistance Rd. The method 90 includes a number of steps or stages represented by blocks 91-107. The method 90 is not limited to the number or order of steps therein, as some steps represented by blocks 91-107 may be performed in a different order than that described below, or fewer than all of the steps may be performed. The method 90 may have a number of variations, such different enabling conditions and different parameters used to calculate Rd.

The method 90 is described in conjunction with the LV controller 42 of FIG. 1, but is not so limited. The method 90 can be performed by any suitable processing device or system, such as a local processor and/or a remote processor.

At block 91, a processor, such as the LV controller 42, receives a triggering signal (e.g., a "power on" signal) from a vehicle control unit. In response, the processor determines the power mode of the vehicle 10. For example, collection of battery parameters is triggered by a power on signal or wake up signal from a vehicle controller.

If the vehicle 10 has been started (block 92), the power on time is recorded at block 93. The processor monitors the power mode of the vehicle 10 and identifies when the power has been turned off (block 94). When the power is off, the power off time is recorded (block 95).

At block 96, the processor calculates a power duration indicating an amount of time during which the power was on, and compares the power duration to a minimum duration (e.g., 300 seconds). If the power duration is sufficient, the processor reads current, voltage and time (block 97) for a desired time increment. The measurements are taken at a plurality of sample times during the time increment. For example, at each sample time, a current value is measured.

At block 98, the current measured over the time increment is compared to a selected current value. For example, a sampled current (current value at a sample time) is checked, and if the sampled current is negative (indicating discharge) and/or is less than a threshold (e.g., −1 amp), the sampled current value (e.g., with voltage and time samples) is stored in a circular buffer or other suitable data structure at block 99. Otherwise, the sampled current is not stored (e.g., is discarded).

At block 100, the processor confirms that the vehicle control unit is still receiving power. If so, the processor compares a difference between the highest stored current value and the lowest stored current value over the time increment, and compares the difference to a threshold (e.g., 8 amps) at block 101. If the vehicle control unit is not receiving power, the method 90 ends (block 100*a*).

At block 102, if the difference is greater than or equal to the difference threshold, a sufficient number of samples have been collected for performing a regression and/or other analysis. At block 103, the stored current values (data points) are inspected, and the data size (i.e., number of data points selected) is compared to a minimum size (e.g., 10 points) at block 104. If the data size is less than the minimum size, the method 90 ends (block 104*a*). If the data size is greater than or equal to the minimum size, the sampled current values are used to estimate Rd.

At block 105, the selected current values (samples) are used to create a one-dimensional array A=[I,1], where I are selected data points. At block 106, Rd is calculated based on the following equation:

$$Rd=(A^TA)^{-1}A^TV,$$

where $A^T$ is the transpose of A, and Vis battery voltage during the power duration. The array is used in a regression to calculate Rd as a slope between a minimum and maximum current. Blocks 105 and 106 represent one example of performing the regression; various other techniques may be used to perform the regression.

The calculated discharging resistance is stored and may be presented to a use or other entity (block 107).

Figure 4:
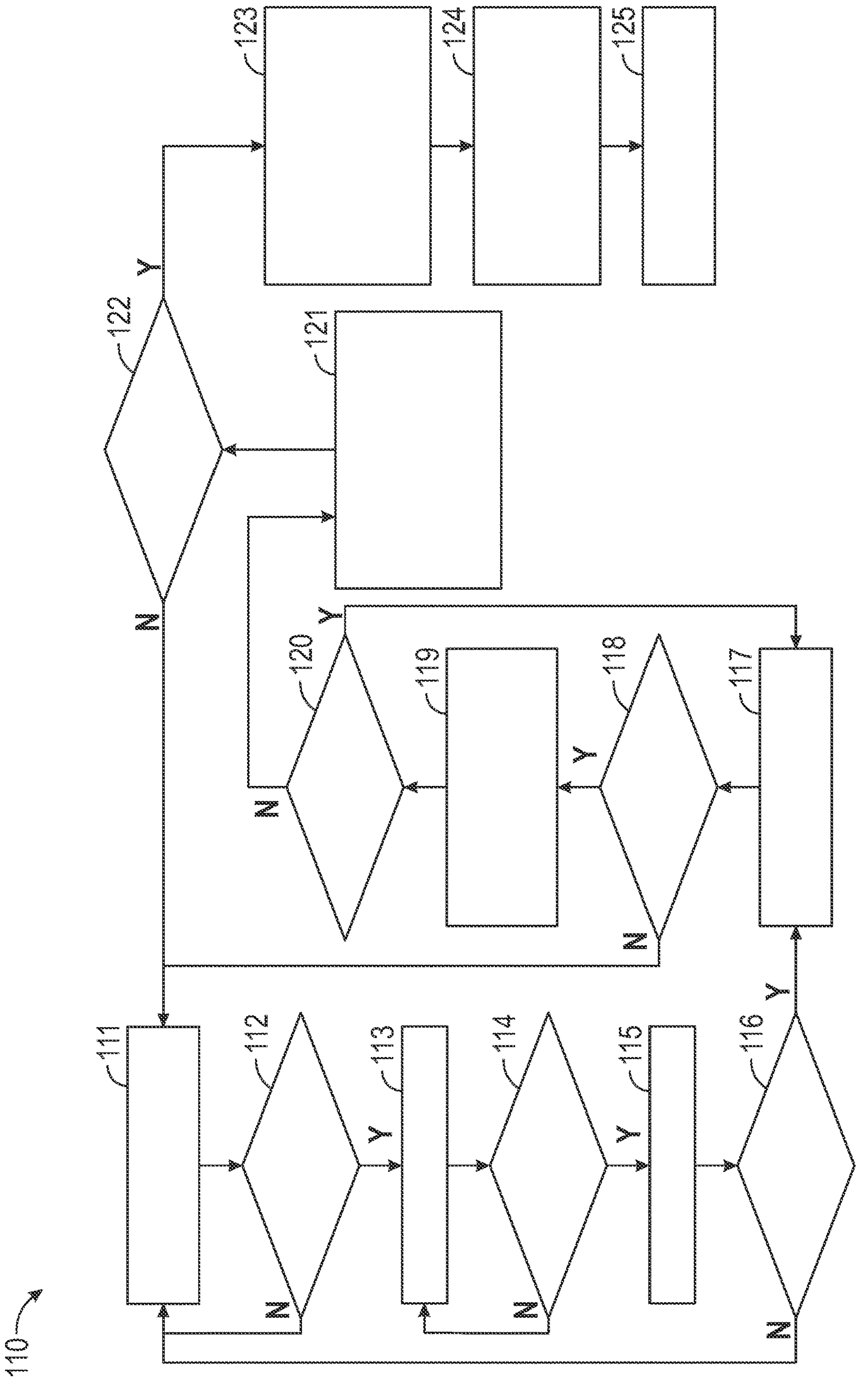
FIG. 4 is a flow diagram depicting aspects of a method of estimating a capacity ratio health indicator, in accordance with an exemplary embodiment.

FIG. 4 depicts an embodiment of a method 110 of estimating the capacity ratio dQ/dV. The method 110 includes a number of steps or stages represented by blocks 111-125. The method 110 is not limited to the number or order of steps therein, as some steps represented by blocks 111-125 may be performed in a different order than that described below, or fewer than all of the steps may be performed.

The method 110 is described in conjunction with the LV controller 42 of FIG. 1, but is not so limited. The method 110 can be performed by any suitable processing device or system, such as a local processor and/or a remote processor.

At block 111, a processor, such as the LV controller 42, receives a triggering signal (e.g., a "power on" signal) from a vehicle control unit. In response, the processor determines the power mode of the vehicle 10. The method 110 is applicable for various vehicle modes (e.g., power on, or wake up modes). It is noted that the specific enabling conditions may vary for different vehicle modes.

If the vehicle 10 has been started (block 112), the power on time is recorded at block 113. The processor monitors the power mode of the vehicle 10 and identifies when the power has been turned off (block 114). When the power is off, the power off time is recorded (block 115).

At block 116, the processor calculates a power duration indicating an amount of time during which the power was on, and compares the power duration to a minimum duration (e.g., 300 seconds). If the power duration is sufficient, the processor reads current, voltage and time (block 117) for a desired time increment. The measurements are taken at a plurality of sample times during the time increment. For example, at each sample time, a current value is measured.

At block 118, the current measured over the time increment is compared to a selected current value. For example, a sampled current (current value at a sample time) is checked, and if the sampled current is negative (indicating discharge) and/or less than a current threshold (e.g., −1 amp), the sampled current and voltage values is stored in a circular buffer or other suitable data structure at block 119. Otherwise, the sampled current is not stored (e.g., is discarded).

At block 120, the processor continues to receive current samples until the total sample time is at least a minimum time (e.g., 120 seconds). Once the total sample time exceeds the minimum time, at block 121, the processor selects samples in which the current is less than a selected current value (e.g., −5 amps), and the voltage is within a selected range (e.g., greater than 12.7 V and less than 12.9 V).

At block 122, the number of selected samples is compared to a minimum number (e.g., 3). If the number of selected samples meets this criterium, the capacity ratio dQ/dV is calculated.

For example, at block 123, a charge value Q is calculated by integrating the current samples over time t, as follows:

$$Q=\int_{t1}^{t2} I(t)dt,$$

where $t_1$ is an initial sample time and $t_2$ is a final sample time.

At block 124, the capacity ratio dQ/dV may be calculated as:

$$dQ/d\mathrm{V}=\frac{\text{charge [0]} - \text{charge [end]}}{\mathrm{V[0]} - \mathrm{V[end]}},$$

where charge[0] is a value of Q at time $t_1$, charge[end] is a value of Q at time $t_2$, V[0] is voltage at time $t_1$ and V[end] is voltage at time $t_2$.

The capacity ratio dQ/dV is stored and may be presented to a use or other entity (block 125).

Figure 5A:
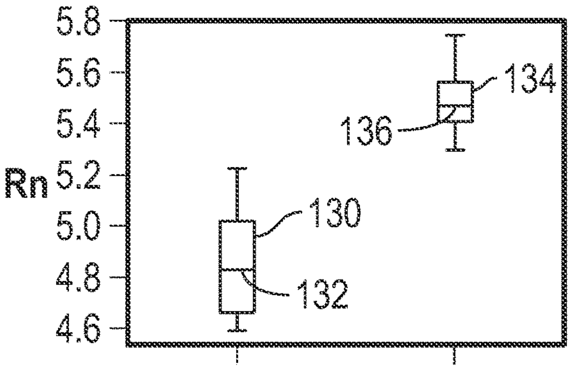
FIGS. 5A-5D depict examples of health indicator values associated with healthy and unhealthy conditions of a low voltage battery.
Figure 5B:
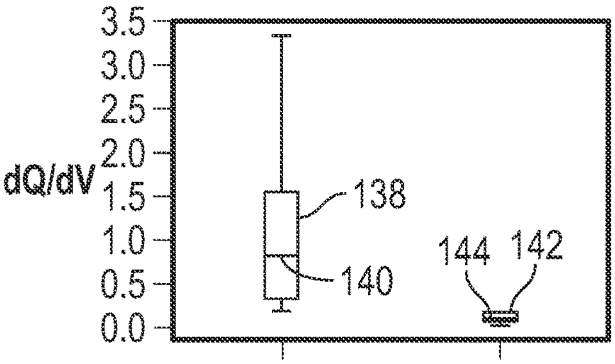

FIGS. 5A-5D show examples of health indicator values, and illustrates advantages of the health indicators described herein. FIGS. 5A-5D show bar graphs for each health indicator with associated uncertainties as error bars. FIG. 5A shows Rn values (bar 130) in Ohms and an average Rn value 132 estimated for a healthy battery, in comparison with Rn values 134 and a median Rn value 136 for an unhealthy battery. FIG. 5B shows dQ/dV values (bar 138) in amp-hours/volt (Ah/V) and an average dQ/dV value 140 estimated for a healthy battery, in comparison with dQ/dV values 142 and an average dQ/dV value 144 for an unhealthy battery.

Figure 5C:
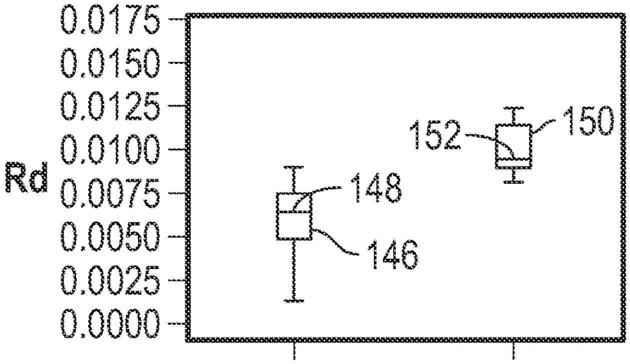
Figure 5D:
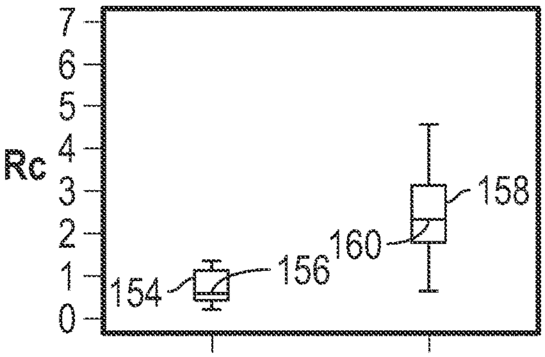

FIG. 5C shows Rd values (bar 146) and an average Rn value 148 estimated for a healthy battery, in comparison with Rd values 150 and an average Rd value 152 for an unhealthy battery. FIG. 5D shows Rc values (bar 154) and an average Rc value 156 estimated for a healthy battery, in comparison with Rc values 158 and an average Rc value 160 for an unhealthy battery.

As shown, these health indicators show very good separation between values indicating a healthy battery and values indicating an unhealthy battery. Such separation makes detection of problems much easier than other conventional indicators.

Figure 6:
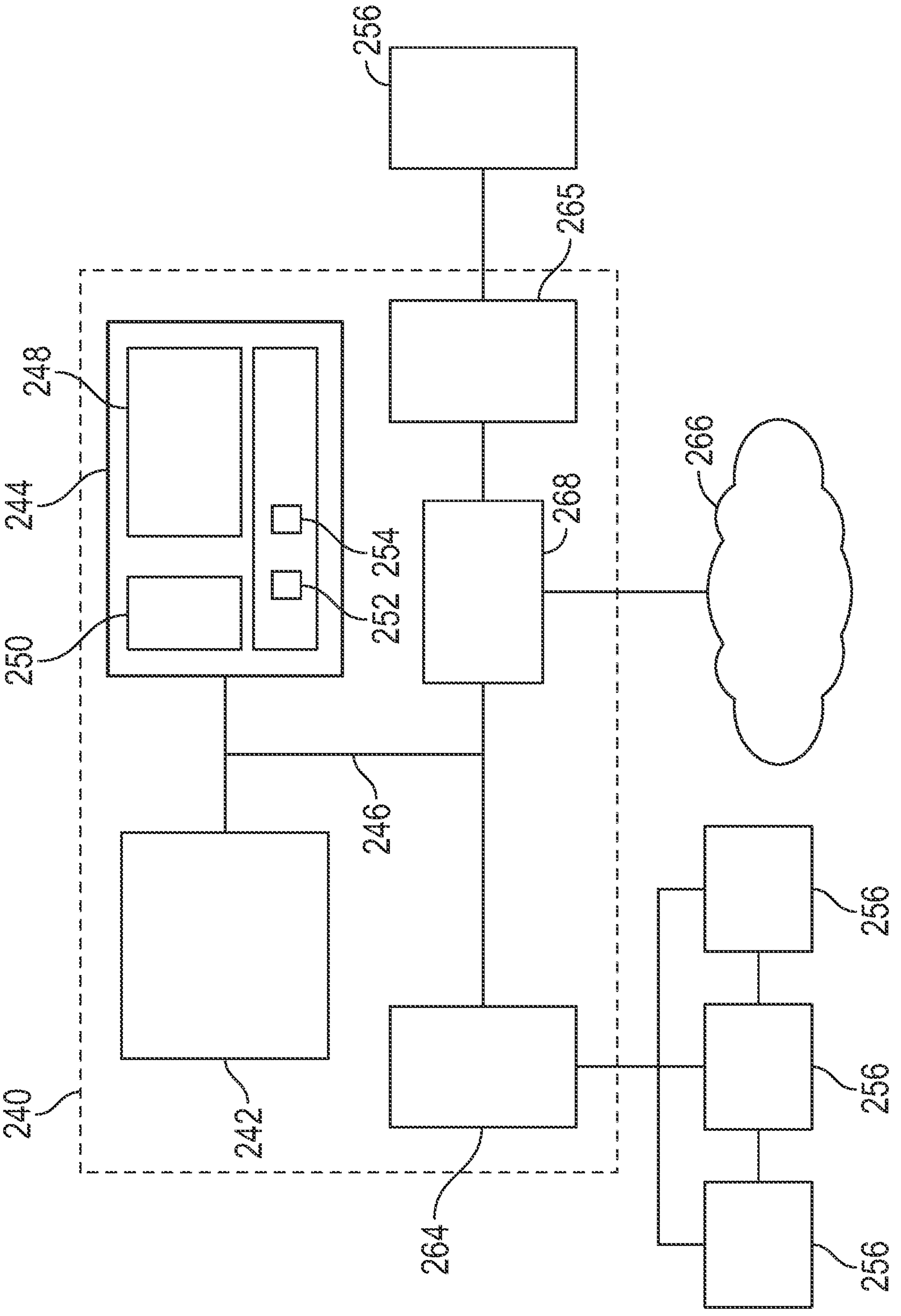
FIG. 6 depicts a computer system in accordance with an exemplary embodiment.

FIG. 6 illustrates aspects of an embodiment of a computer system 240 that can perform various aspects of embodiments described herein. The computer system 240 includes at least one processing device 242, which generally includes one or more processors for performing aspects of image acquisition and analysis methods described herein.

Components of the computer system 240 include the processing device 242 (such as one or more processors or processing units), a memory 244, and a bus 246 that couples various system components including the system memory 244 to the processing device 242. The system memory 244 can be a non-transitory computer-readable medium, and may include a variety of computer system readable media. Such media can be any available media that is accessible by the processing device 242, and includes both volatile and non-volatile media, and removable and non-removable media.

For example, the system memory 244 includes a non-volatile memory 248 such as a hard drive, and may also include a volatile memory 250, such as random access memory (RAM) and/or cache memory. The computer system 240 can further include other removable/non-removable, volatile/non-volatile computer system storage media.

The system memory 244 can include at least one program product having a set (i.e., at least one) of program modules that are configured to carry out functions of the embodiments described herein. For example, the system memory 244 stores various program modules that generally carry out the functions and/or methodologies of embodiments described herein. A module 252 may be included for performing functions related to acquiring signals and data, and a module 254 may be included to perform functions related to battery health determination as discussed herein. The system 240 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 242 can also communicate with one or more external devices 256 as a keyboard, a pointing device, and/or any devices (e.g., network card, modem, etc.) that enable the processing device 242 to communicate with one or more other computing devices. Communication with various devices can occur via Input/Output (I/O) interfaces 264 and 265.

The processing device 242 may also communicate with one or more networks 266 such as a local area network (LAN), a general wide area network (WAN), a bus network and/or a public network (e.g., the Internet) via a network adapter 268. It should be understood that although not shown, other hardware and/or software components may be used in conjunction with the computer system 240. Examples include, but are not limited to: microcode, device drivers, redundant processing units, external disk drive arrays, RAID systems, and data archival storage systems, etc.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of evaluating a low voltage (LV) battery system, comprising:

collecting parameters of the LV battery system, the parameters including at least one of a voltage, a current, a temperature and a state of charge (SOC);

determining a health of the LV battery system based on one or more health indicators of a plurality of health indicators, the plurality of health indicators including a charging resistance, a ripple resistance, a dynamic discharging resistance and a capacity ratio, the capacity ratio being a ratio of a change in capacity to a change in voltage; and based on determining that the battery system is in an unhealthy condition, identifying a cause of the unhealthy condition based on a selection of a set of health indicators, wherein determining the health of the LV battery system includes:

identifying an enabling condition related to charging or discharging of the LV battery system;

selecting the set of health indicators from the plurality of health indicators based on the identified enabling condition, and estimating a value of each of the set of health indicators; and determining whether the LV battery system is in a healthy condition or the unhealthy condition based on the collected parameters and the value of each of the set of health indicators; and controlling power transfer based on determining the health of the LV battery system, the power transfer including at least one of charging the LV battery system and discharging the LV battery system to a vehicle component.

2. The method of claim 1, wherein the the capacity ratio and the dynamic discharging resistance is estimated based on measuring a current by taking a plurality of current samples over a selected time increment and wherein the measuring is automatically initiated based on a triggering signal output from a vehicle control unit.

3. The method of claim 1, wherein:

the cause is identified as a shorted cell in the LV battery system based on the charging resistance having a value above a charging resistance threshold;

the cause is identified as a low state of health (SOH) based on at least one of: a value of the charging resistance being above the charging resistance threshold, a value of the ripple resistance being above a ripple resistance threshold, a value of the dynamic discharging resistance being above a discharging resistance threshold, and a value of the capacity ratio being at or below a capacity ratio threshold; and the cause is identified as a low SOC based on the collected SOC being below a selected SOC, and at least one of: the value of the charging resistance being at or below the charging resistance threshold, the value of the ripple resistance being at or below the ripple resistance threshold, the value of the dynamic discharging resistance being at or below the discharging resistance threshold, and the value of the capacity ratio being above the capacity ratio threshold.

4. The method of claim 1, wherein the enabling condition for the charging resistance and the ripple resistance is a charging condition in which the LV battery system is being charged, and the enabling condition for the dynamic discharging resistance and the capacity ratio is a discharging condition in which the LV battery system is being discharged.

5. The method of claim 4, wherein the enabling condition for the capacity ratio and the dynamic discharging resistance is a condition in which the LV battery system is turned off for a selected period of time.

6. The method of claim 5, wherein a value of the dynamic discharging resistance is calculated based on a regression of current values sampled during the selected period of time.

7. The method of claim 5, wherein a value of the capacity ratio is calculated based on integrating current values sampled during the selected period of time.

8. The method of claim 1, wherein the LV battery system is part a vehicle, the vehicle including a high voltage battery system configured to power an electric motor.

9. A system for evaluating a low voltage (LV) battery system, comprising:

a processing device configured to collect parameters of the LV battery system, the parameters including at least one of a voltage, a current, a temperature and a state of charge (SOC), the processing device configured to determine a health of the LV battery system based on one or more health indicators of a plurality of health indicators, the plurality of health indicators including a charging resistance, a ripple resistance, a dynamic discharging resistance and a capacity ratio, the capacity ratio being a ratio of a change in capacity to a change in voltage, and based on determining that the battery system is in an unhealthy condition, identify a cause of the unhealthy condition based on a selection of a set of health indicators, wherein the processing device is configured to determine the health by:

identifying an enabling condition of the battery system, the enabling condition related to charging or discharging of the battery system;

selecting the set of the health indicators based on the identified enabling condition, and estimating a value of each of the set of health indicators; and determining whether the LV battery system is in a healthy condition or the unhealthy condition based on the collected parameters and the value of each of the set of health indicators; and wherein the processing device is configured to control power transfer based on determining the health of the LV battery system, the power transfer including at least one of charging the LV battery system and discharging the LV battery system to a vehicle component.

10. The system of claim 9, wherein the capacity ratio and the dynamic discharging resistance is estimated based on measuring a current by taking a plurality of current samples over a selected time increment and wherein the measuring is automatically initiated based on a triggering signal output from a vehicle control unit.

11. The system of claim 9, wherein:

the cause is identified as a shorted cell in the LV battery system based on the charging resistance having a value above a charging resistance threshold;

the cause is identified as a low state of health (SOH) based on at least one of: a value of the charging resistance being above the charging resistance threshold, a value of the ripple resistance being above a ripple resistance threshold, a value of the dynamic discharging resistance being above a discharging resistance threshold, and a value of the capacity ratio being at or below a capacity ratio threshold; and the cause is identified as a low SOC based on the collected SOC being below a selected SOC, and at least one of: the value of the charging resistance being at or below the charging resistance threshold, the value of the ripple resistance being at or below the ripple resistance threshold, the value of the dynamic discharging resistance being at or below the discharging resistance threshold, and the value of the capacity ratio being above the capacity ratio threshold.

12. The system of claim 9, wherein the enabling condition for the charging resistance and the ripple resistance is a charging condition in which the LV battery system is being charged, and the enabling condition for the dynamic discharging resistance and the capacity ratio is a discharging condition in which the LV battery system is being discharged.

13. The system of claim 12, wherein the enabling condition for the capacity ratio and the dynamic discharging resistance is a condition in which the LV battery system is turned off for a selected period of time.

14. The system of claim 13, wherein a value of the dynamic discharging resistance is calculated based on a regression of current values sampled during the selected period of time.

15. The system of claim 13, wherein a value of the capacity ratio is calculated based on integrating current values sampled during the selected period of time.

16. The system of claim 9, wherein the LV battery system is part of a vehicle, the vehicle including a high voltage battery system configured to power an electric motor.

17. A vehicle system, comprising:

a low voltage (LV) battery system configured to power LV components of a vehicle;

a processing device configured to collect parameters of the LV battery system, the parameters including at least one of a voltage, a current, a temperature and a state of charge (SOC), the processing device configured to determine a health of the LV battery system based on one or more health indicators of a plurality of health indicators, the plurality of health indicators including a charging resistance, a ripple resistance, a dynamic discharging resistance and a capacity ratio, the capacity ratio being a ratio of a change in capacity to a change in voltage, and based on determining that the battery system is in an unhealthy condition, identify a cause of the unhealthy condition based on a selection of a set of health indicators, wherein the processing device is configured to determine the health by:

identifying an enabling condition of the battery system, the enabling condition related to charging or discharging of the battery system;

selecting the set of the health indicators based on the identified enabling condition, and estimating a value of each of the set of health indicators; and determining whether the LV battery system is in a healthy condition or the unhealthy condition based on the collected parameters and the value of each of the set of health indicators; and a controller configured to control power transfer based on determining the health of the LV battery system, the power transfer including at least one of charging the LV battery system and discharging the LV battery system to a vehicle component.

18. The vehicle system of claim 17, wherein the capacity ratio and the dynamic discharging resistance is estimated based on measuring a current by taking a plurality of current samples over a selected time increment and wherein the measuring is automatically initiated based on a triggering signal output from a vehicle control unit.

19. The vehicle system of claim 17, wherein:

the cause is identified as a shorted cell in the LV battery system based on the charging resistance having a value above a charging resistance threshold;

the cause is identified as a low state of health (SOH) based on at least one of: a value of the charging resistance being above the charging resistance threshold, a value of the ripple resistance being above a ripple resistance threshold, a value of the dynamic discharging resistance being above a discharging resistance threshold, and a value of the capacity ratio being at or below a capacity ratio threshold; and the cause is identified as a low SOC based on the collected SOC being below a selected SOC, and at least one of: the value of the charging resistance being at or below the charging resistance threshold, the value of the ripple resistance being at or below the ripple resistance threshold, the value of the dynamic discharging resistance being at or below the discharging resistance threshold, and the value of the capacity ratio being above the capacity ratio threshold.

20. The vehicle system of claim 17, wherein the enabling condition for the charging resistance and the ripple resistance is a charging condition in which the LV battery system is being charged, and the enabling condition for the dynamic discharging resistance and the capacity ratio is a discharging condition in which the LV battery system is being discharged.

* * * * *